(12) United States Patent
Lin

(10) Patent No.: US 9,065,454 B2
(45) Date of Patent: Jun. 23, 2015

(54) PHASE LOCKED LOOP WITH SELF-CALIBRATION

(71) Applicant: Taiwan Semiconductor Manufacturing Company, Ltd., Hsin-Chu (TW)

(72) Inventor: Yu-Tso Lin, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/774,757

(22) Filed: Feb. 22, 2013

(65) Prior Publication Data

US 2014/0145769 A1    May 29, 2014

Related U.S. Application Data

(60) Provisional application No. 61/731,094, filed on Nov. 29, 2012.

(51) Int. Cl.
| | |
|---|---|
| *H03L 7/06* | (2006.01) |
| *H03L 7/099* | (2006.01) |
| *H03L 7/087* | (2006.01) |
| *H03L 7/18* | (2006.01) |

(52) U.S. Cl.
CPC ............... *H03L 7/099* (2013.01); *H03L 7/087* (2013.01); *H03L 7/18* (2013.01); *H03L 2207/06* (2013.01)

(58) Field of Classification Search
USPC ........................................................ 327/156
See application file for complete search history.

(56) References Cited

U.S. PATENT DOCUMENTS

| 6,552,618 B2 | 4/2003 | Nelson et al. |
| 2005/0137816 A1* | 6/2005 | Chuang et al. ............... 702/106 |
| 2008/0100385 A1* | 5/2008 | Lin .................................. 331/16 |
| 2010/0213984 A1* | 8/2010 | Shin et al. ...................... 327/105 |
| 2011/0057696 A1* | 3/2011 | Hsieh et al. .................... 327/157 |

OTHER PUBLICATIONS

Shin, Jaewook, et al., "A 1.9-3.8 GHz Sigma-Delta Fractional-N PLL Frequency Synthesizer with Fast Auto-Calibration of Loop Bandwidth and VCO Frequency," IEEE Journal of Solid-State Circuits, vol. 47, No. 3, Mar. 2012, pp. 665-675.

* cited by examiner

*Primary Examiner* — Lincoln Donovan
*Assistant Examiner* — Patrick Chen
(74) *Attorney, Agent, or Firm* — Slater & Matsil, L.L.P

(57) ABSTRACT

A method for self-calibrating a phase locked loop (PLL) includes setting a frequency range setting of a voltage controlled oscillator (VCO) to a first digital value for a first output frequency. A first difference is measured between a reference frequency and a feedback frequency resulting from the first output frequency. The frequency range setting is set to an inverted digital value of the first digital value for a second output frequency. A second difference is measured between the reference frequency and the feedback frequency resulting from the second output frequency. A value of the frequency range setting is selected based on the first difference and the second difference.

19 Claims, 4 Drawing Sheets

PHASE LOCKED LOOP WITH SELF-CALIBRATION

This application claims priority to U.S. Provisional Application Ser. No. 61/731,094, filed on Nov. 29, 2012, entitled "Phase Locked Loop with Self-Calibration," which application is hereby incorporated herein by reference.

TECHNICAL FIELD

The present disclosure relates generally to an integrated circuit and more particularly a phase locked loop (PLL).

BACKGROUND

For some integrated circuits including a PLL, each voltage controlled oscillator (VCO) in the PLL is tested at the factory for calibration to characterize the available frequency ranges and to predetermine its frequency range setting appropriate for desired output frequencies. When a VCO is selected for a particular application, the appropriate calibration setting is permanently burned into the device, e.g., by blowing fuse links. The factory testing and hard-wiring of the VCO adds to the cost of manufacturing the PLL and also limits the operating frequency range of each PLL to the permanently selected frequency range.

BRIEF DESCRIPTION OF THE DRAWINGS

Reference is now made to the following descriptions taken in conjunction with the accompanying drawings, in which.

DETAILED DESCRIPTION

Figure 1:
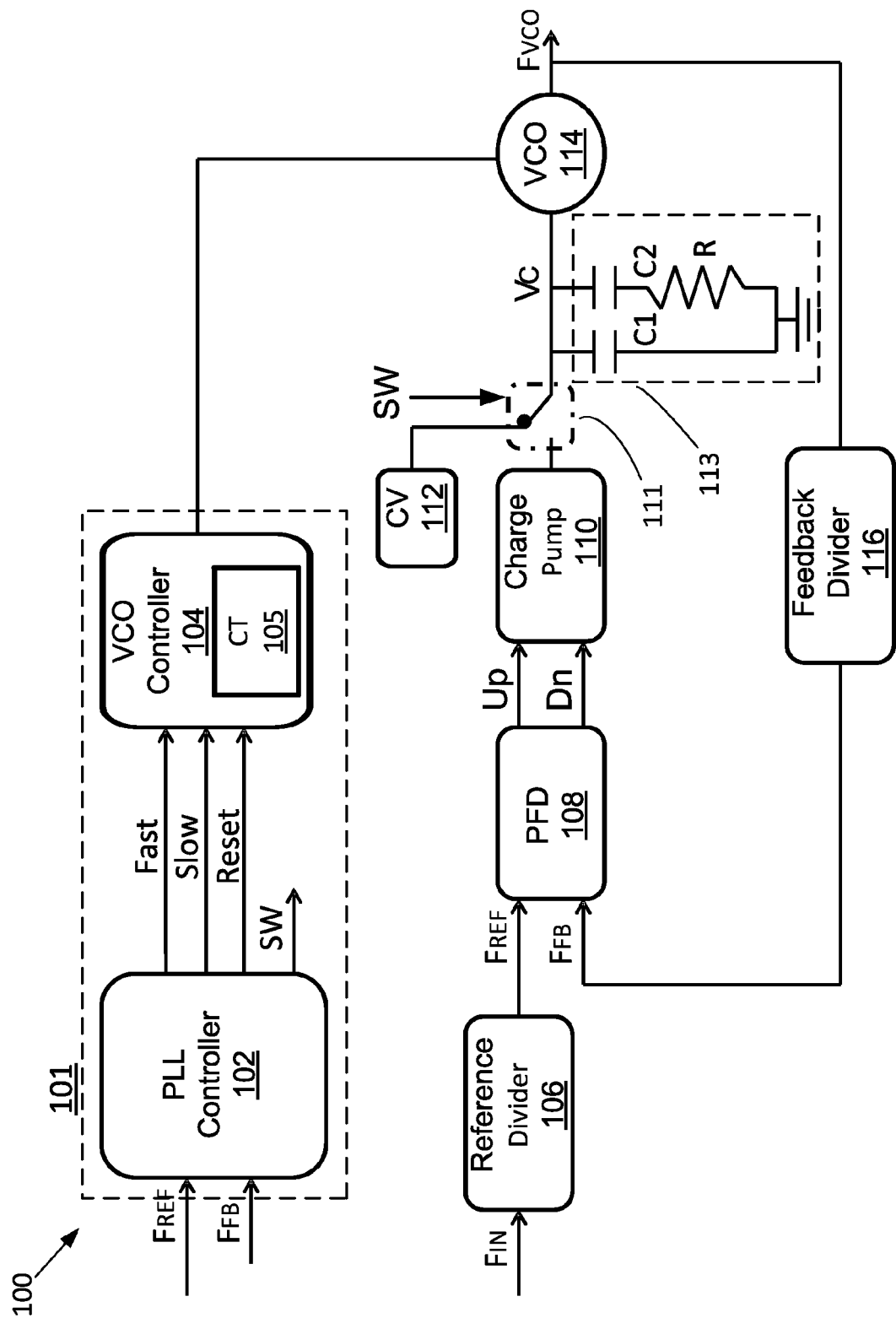
FIG. 1 is a schematic diagram of an exemplary PLL with self-calibration according to some embodiments.

The making and using of various embodiments are discussed in detail below. It should be appreciated, however, that the present disclosure provides many applicable inventive concepts that can be embodied in a wide variety of specific contexts. The specific embodiments discussed are merely illustrative of specific ways to make and use, and do not limit the scope of the disclosure.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a schematic diagram of an exemplary PLL 100 with self-calibration according to some embodiments. An input signal with frequency Fin is provided to a reference divider 106. The reference divider 106 divides the frequency Fin to provide a reference frequency $F_{REF}$. A phase/frequency detector (PFD) 108 compares the frequency/phase of $F_{REF}$ to the frequency/phase of the feedback frequency $F_{FB}$ and generates an output signal Up or Dn.

The Up signal indicates that the phase of $F_{REF}$ leads the phase of $F_{FB}$, thus the frequency $F_{REF}$ is higher than $F_{FB}$ in some embodiments. The Dn signal indicates that the phase of $F_{FB}$ leads the phase of $F_{REF}$, thus the frequency $F_{FB}$ is higher than $F_{REF}$. The width of the output signal pulse (e.g., Up or Dn) indicates the magnitude of the difference between $F_{REF}$ and $F_{FB}$.

A charge pump 110 generates an amount of charge in accordance with the magnitude and polarity of the output signal from the PFD 108. The charge pump 110 is coupled to a loop filter 113 depending on a switch 111 that connects the loop filter 113 to either a controlled voltage circuit (CV) 112 or the charge pump 110. Depending upon the polarity of the error signal (i.e., whether up or down), the charge is either added to or subtracted from the capacitors (e.g., C1 and C2) in the loop filter 113. The loop filter 113 operates as a low pass filter or an integrator that accumulates the net charge from the charge pump 110. The loop filter 113 with two capacitors C1 and C2 and a resistor R is one example, and there can be many other embodiments.

A VCO 114 is connected to the loop filter 113. The charge pump 110 or the CV 112 coupled with the loop filter 113 provides a VCO input voltage Vc depending on the switch 111. The VCO 114 provides an output frequency Fvco as an output of the PLL, based on its input voltage Vc and a frequency range setting (digital value) of CT 105. The Fvco is divided by the feedback divider 116 and provided to the PFD 108 as $F_{FB}$.

A self-calibration controller module 101 includes a PLL controller 102 and a VCO controller 104. The functions described below for the PLL controller 102 and the VCO controller 104 can be shared or divided differently between the PLL controller 102 and the VCO controller 104 in other embodiments.

The PLL controller 102 receives and compares the frequency/phase of $F_{REF}$ to the frequency/phase of the feedback frequency $F_{FB}$ to generate output signals Fast or Slow. The Fast signal indicates that the phase of $F_{REF}$ leads the phase of $F_{FB}$, thus the frequency $F_{REF}$ is higher than $F_{FB}$. The Slow signal indicates that the phase of $F_{FB}$ leads the phase of $F_{REF}$, thus the frequency $F_{FB}$ is higher than $F_{REF}$. The width of the output signal pulse (e.g., Fast or Slow) indicates the magnitude of the difference between $F_{REF}$ and $F_{FB}$. The PLL controller 102 also provides a Reset signal to the VCO controller 104 and a SW signal to the switch 111 to connect CV 112 to the loop filter 113 and VCO 114 for self-calibration.

The VCO controller 104 includes a frequency range setting CT 105 that has a digital value with N bits. In some embodiments, CT 105 comprises registers or memory to store the digital value. Each of the CT values corresponds one of many operating curves of Vc vs. Fvco available for VCO 114 as described further below.

Figure 2:
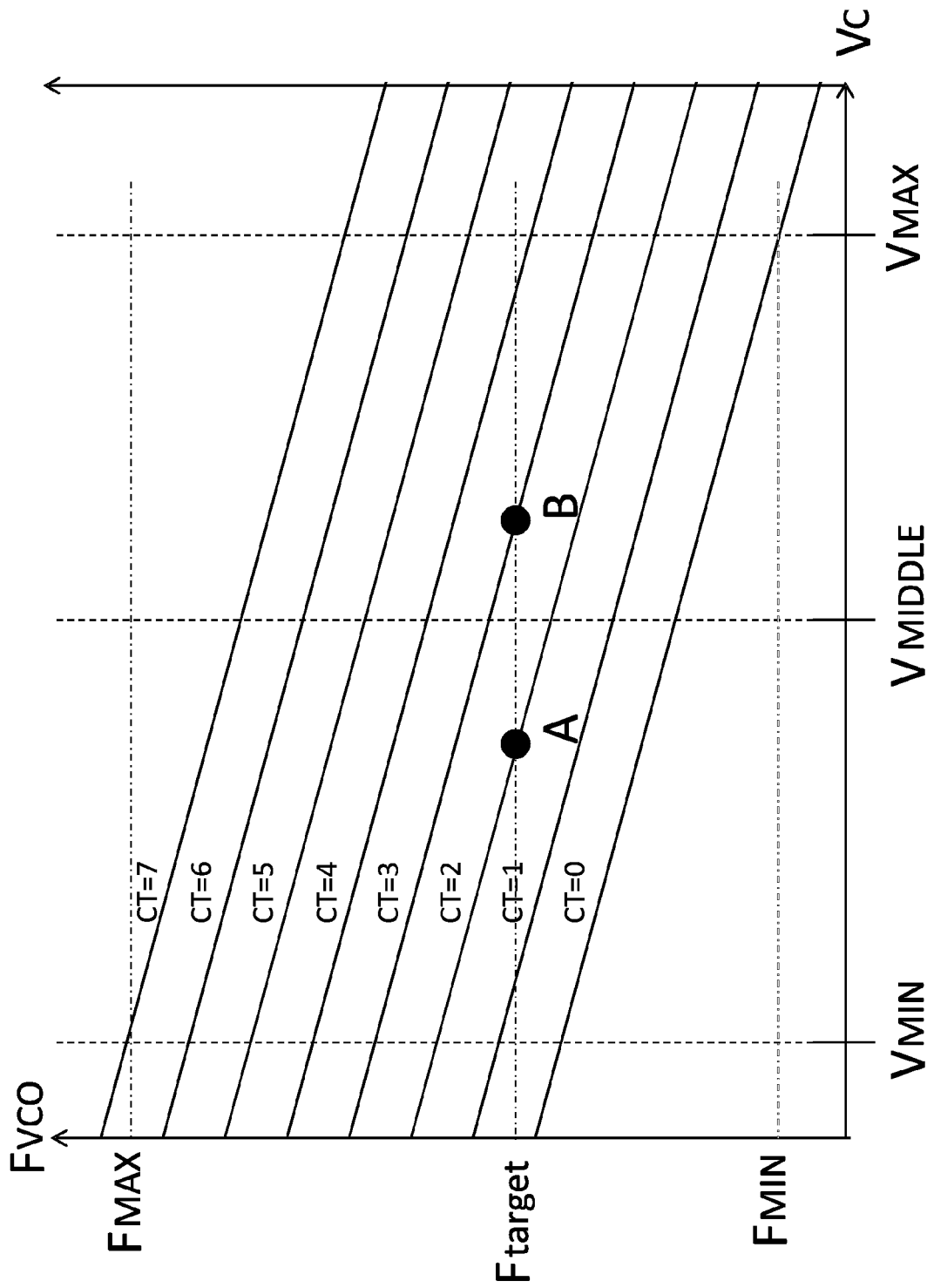
FIG. 2 are exemplary operating curves of the VCO input voltage (Vc) vs. VCO output frequency (Fvco) with different frequency range setting (digital values with 3 bits) in the exemplary PLL in FIG. 1 according to some embodiments.

FIG. 2 are exemplary operating curves of the VCO input voltage (Vc) vs. VCO output frequency (Fvco) with different frequency range setting CT (3 bit digital value) in the exemplary PLL 100 in FIG. 1 according to some embodiments. The input voltage Vc operation range is from Vmin to Vmax. The Fvco operation range is from Fmin to Fmax. Because VCO's are designed for a wide frequency range, VCO's have a number of operating curves with corresponding frequency ranges as shown to cover the wide frequency range.

For example, the frequency ranges of the operating curves corresponding to different CT values for CT=0 to 7 (i.e., CT=000 to CT=111 for 3 bit digital CT values) cover the operating frequency range from Fmin to Fmax. The frequency range setting CT is used to select one of the operating curves with a corresponding frequency range. (The process of selecting a VCO operating curve is sometimes referred to as trimming.)

For a specific PLL application with a specific operating frequency range, one of the VCO operating curves can be selected that has a center frequency close to the target frequency. The center frequency can be generally found with Vc set to a center (middle) voltage Vmiddle of the operating voltage range from Vmin to Vmax. An optimal VCO frequency range for a target frequency Ftarget can be selected during self-calibration process of the PLL 100 as described below.

Figure 3:
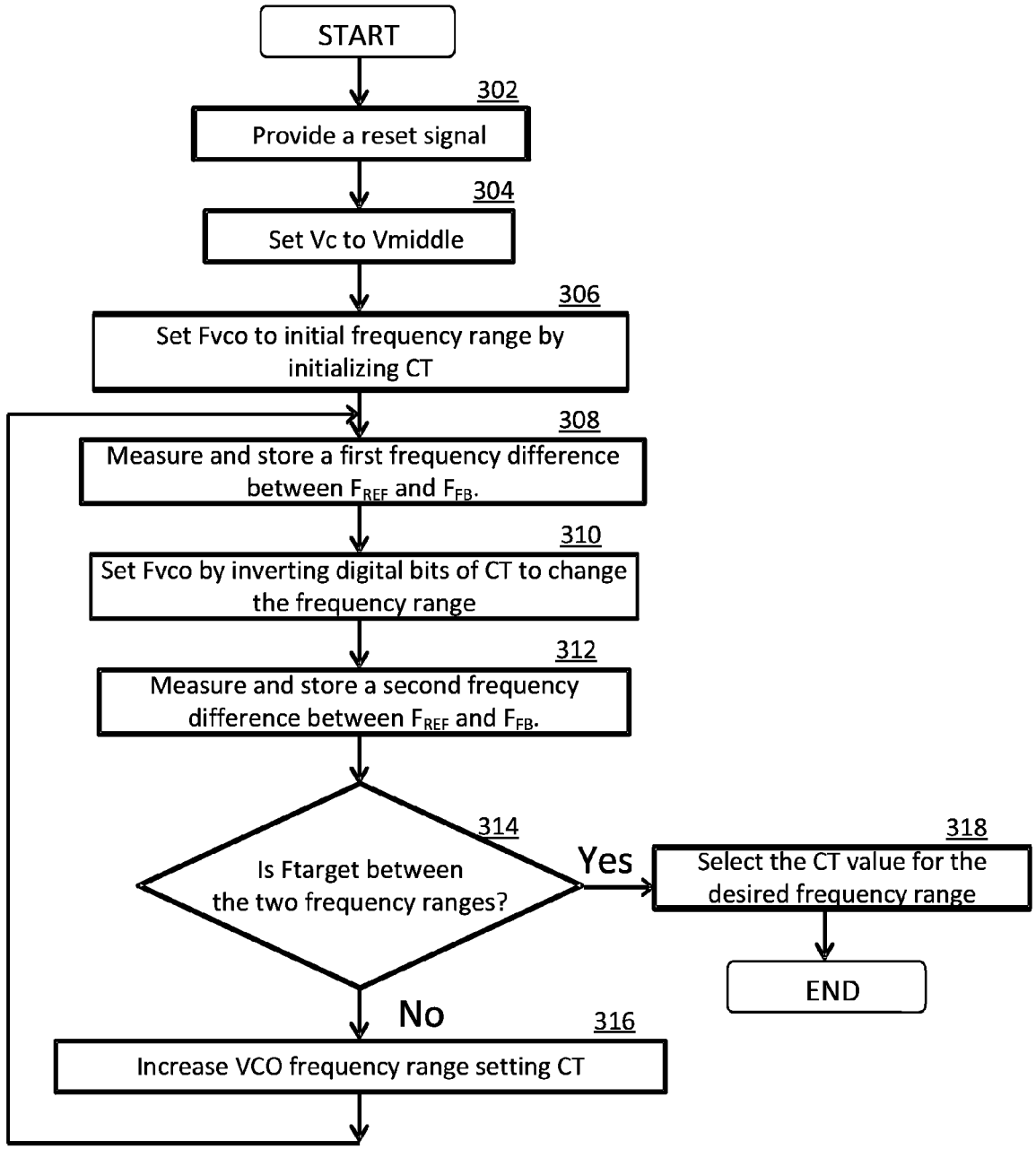
FIG. 3 is a flowchart of an exemplary method for self-calibrating the PLL in FIG. 1 according to some embodiments.
Figure 4:
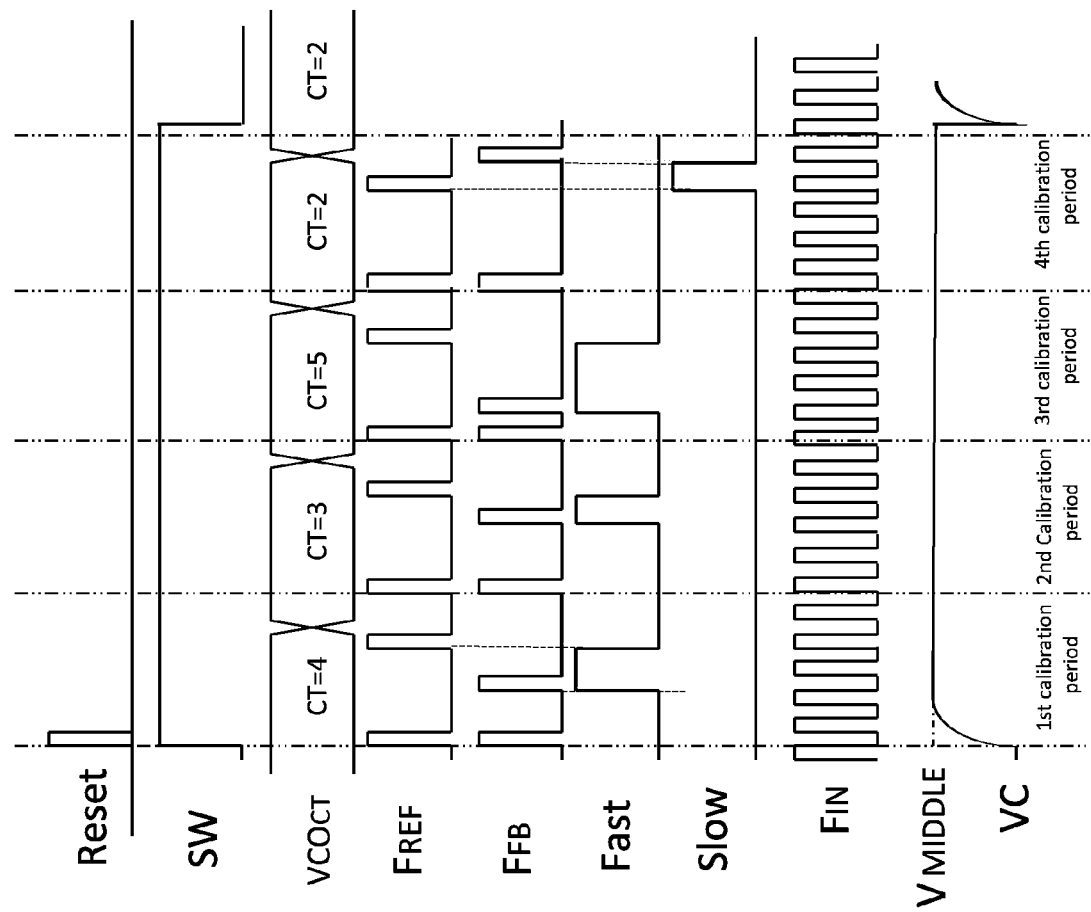
FIG. 4 is a plot of exemplary signal waveforms of the PLL in FIG. 1 according to some embodiments.

FIG. 3 is a flowchart of an exemplary method for self-calibrating the PLL 100 in FIG. 1 according to some embodiments. The method is described below with reference to FIG. 4. FIG. 4 is a plot of exemplary signal waveforms of the PLL 100 in FIG. 1 according to some embodiments.

At step 302, a reset signal is provided by the PLL controller 102 to the VCO controller 104 as shown by a Reset pulse in FIG. 4. The node with Vc is connected to the CV 112 at the initial stage for auto self-calibration by the switch 111 controlled by the SW waveform as shown in FIG. 4.

At step 304, the CV sets Vc to a middle voltage value (Vmiddle in FIG. 2) as shown by the Vc waveform in FIG. 4. There can be a certain rise time depending on the loop filter 113 response time.

At step 306, Fvco is set to an initial frequency range by initializing CT. In some embodiments, the VCO controller 104 sets the Fvco to the middle frequency range by setting CT to a digital value of $2^{(N-1)}$ where N is the number of bits of CT. In this example, CT is set to 4 (binary 100 for CT with 3 bits) indicated in the VCOcT waveform in FIG. 4 at the first calibration period.

At step 308, a first frequency difference between the reference signal $F_{REF}$ and the feedback signal $F_{FB}$ is measured and stored. For example, the waveforms for $F_{REF}$ and $F_{FB}$ are shown in FIG. 4. The PLL controller 102 compares the speed of $F_{REF}$ and $F_{FB}$. If the second rising edge of $F_{FB}$ leads the second rising edge of $F_{REF}$, then the Fast signal at a corresponding register output in the PLL controller 102 is set to a logic 1 for the time duration between two rising edges, as shown by the Fast waveform in FIG. 4. Moreover, if the second rising edge of $F_{FB}$ lags the second rising edge of $F_{REF}$, then the Slow signal at a corresponding register output in the PLL controller 102 is set logic 1 for the time duration between two edges. The PLL controller 102 measures and stores the frequency difference at the first calibration period.

At step 310, Fvco is set to a different frequency by inverting all digital bits of CT to change the frequency range. The frequency range setting CT changes to 3 (binary 011) by inverting all CT bits (previously binary 100 for CT=4) at the second calibration period, as indicated in the waveform VCOcT in FIG. 4. The CT values (CT=4 and CT=3) prior to and after inverting the CT values are considered as a set.

At step 312, the PLL controller 102 measures and stores a second frequency difference between $F_{REF}$ and $F_{FB}$ in the same way as to compare $F_{REF}$ and $F_{FB}$ in step 308.

At step 314, it is determined whether the target frequency Ftarget represented by $F_{REF}$ for self-calibration is between the two frequency ranges set at the current calibration period (after inverting CT bits, e.g., CT=3) and the previous calibration period (prior to inverting CT bits, e.g., CT=4). If the logic values of Fast or Slow signal register during the last two calibration periods are the same (1 and 1 or 0 and 0), this indicates that the Ftarget is not between the frequency ranges of the current (CT=3) and the last (CT=4) frequency range settings. In this case, the process proceeds to step 316.

At step 316, the VCO controller 104 increases the VCO frequency range setting CT from CT=4 (binary 100, which is the CT value prior to inverting bits) to CT=5 (binary 101), as indicated in the waveform VCOcT in FIG. 4 at the third calibration period.

Then the process proceeds back to step 308, the PLL controller 102 compares the speed of $F_{REF}$ and $F_{FB}$ in the same way as to compare $F_{REF}$ and $F_{FB}$ in step 308. The PLL controller 102 measures and stores the frequency difference at the third calibration period.

Back at step 310, all the bits of CT=5 (binary 101) are inverted again to CT=2 (binary 010) at the fourth calibration period.

Back at step 312, the PLL controller 102 measures and stores a second frequency difference between $F_{REF}$ and $F_{FB}$ at the fourth calibration period in the same way as to compare $F_{REF}$ and $F_{FB}$ in step 308.

Back at step 314, if the logic values during the last two calibration periods (e.g., the third and the fourth) of Fast and Slow signal registers are different (1 and 0 or 0 and 1), this indicates that Ftarget is between the current (CT=2) and the last setting (CT=5). Then the process proceeds to step 318. For example, in FIG. 4, the waveforms Fast and Slow during the third and the fourth calibration periods have different logic values (1 and 0). This indicates that the Ftarget is between the two frequency ranges of the current (after inverting CT bits, e.g., CT=2) and the last (prior to inverting CT bits, e.g., CT=5) frequency range setting.

At step 318, the VCC controller 104 selects which frequency range setting CT has a frequency range closer to the Ftarget. The CT values prior to and after inverting the CT value at step 310 are considered as a set. The shorter pulse duration of the Slow signal for CT=2 in FIG. 4 compared to the Fast signal for CT=5 in FIG. 4 indicates that CT=2 has a center frequency closer to Ftarget than CT=5. Thus, between the CT value set of CT=2 and CT=5, CT=2 is further considered for selection.

Then CT=3 after inverting bits in step 310 in the previous CT set values (CT=4 and CT=3) is compared to CT=2, since CT=2 is also a CT value after inverting bits in step 310. Likewise, if CT=5 (prior to inverting CT value) is selected over CT=2 in the current CT value set, then CT=4 (prior to inverting CT value) in the previous CT value set will be compared to CT=5. In the present example, since the Slow signal pulse duration for CT=2 at the fourth calibration period is shorter than the Fast signal pulse duration for CT=3 at the second calibration period, CT=2 is finally selected as an optimal CT value that has a frequency range closest to Ftarget, and the CT value is kept to begin a normal operation of the PLL 100 when the charge pump 110 is connected to the loop filter 113 by the switch 111. In FIG. 2, points A and B are shown for CT=2 and CT=3 respectively that that corresponds to Ftarget. Even though CT=2 is selected as an optimal value, CT=3 can also work for PLL 100 to provide Ftarget.

In some embodiments, the frequency range is selected based on the shortest duration of Fast or Slow signal when two adjacent frequency ranges (with consecutive CT values) are found, where one is fast, and one is slow compared to Ftarget. Because of the overlap between the two frequency ranges with varying VCO input voltage Vc, both frequency ranges include the Ftarget and either one can be used. By using this method in FIG. 4, the PLL 100 can calibrate faster since the PLL 100 locks around the Vmiddle in many situations. Moreover, by selecting the frequency range having the shortest duration of fast or slow signal, Ftarget will be positioned closer to the center of the frequency range.

Moreover, if the frequency at VCO frequency setting (CT=3) is more close to the target VCO frequency than the one at VCO frequency setting (CT=4), the optimal frequency range setting is selected between the last VCO frequency setting (CT=2) and the prior VCO frequency setting (CT=3).

After the self-calibration process, the switch connects the output of the charge pump to the loop filter, and the PLL operates at a normal closed-loop mode as shown in FIG. 1.

The PLL 100 uses a specific search to self-calibrate the VCO frequency range while entering auto calibration. This approach not only prevents the requirement to hardwire the frequency range during process, supply voltage, and temperature variations, but also ensures the PLL operating at the optimal VCO frequency range.

While the invention has been particularly shown and described with reference to the preferred embodiments thereof, these are, of course, merely examples to help clarify the invention and are not intended to limit the invention. It will be understood by those skilled in the art that various changes, modifications, and alterations in form and details may be made therein without departing from the spirit and scope of the invention, as set forth in the following claims.

The prior art conducts a linear search to self-calibrate the VCO frequency range using a simple process. However, there are some situations where the frequency range selected by the pll controller, VCO controller, could be further optimized. It could be two VCO ranges that include the target VCO frequency, and the optimal VCO frequency range can be selected during self-calibration in the implementation of the PLL. This approach not only prevents the requirement to hardwire the frequency range during process, supply voltage, and temperature variations, but also ensures the PLL operating at the optimal VCO frequency range.

According to some embodiments, a method for self-calibrating a phase locked loop (PLL) includes setting a frequency range setting of a voltage controlled oscillator (VCO) to a first digital value so that the VCO outputs a first output frequency. A first difference is measured between a reference frequency and a feedback frequency resulting from the first output frequency. The frequency range setting is set to an inverted digital value of the first digital value so that the VCO outputs a second output frequency. A second difference is measured between the reference frequency and the feedback frequency resulting from the second output frequency. A value of the frequency range setting is selected based on the first difference and the second difference.

According to some embodiments, a phase locked loop (PLL) with self-calibration includes means for setting a frequency range setting of a voltage controlled oscillator (VCO) to a first digital value for a first output frequency, means for measuring a first difference between a reference frequency and a feedback frequency resulting from the first output frequency, means for setting the frequency range setting to an inverted digital value of the first digital value for a second output frequency, means for measuring a second difference between the reference frequency and the feedback frequency resulting from the second output frequency, and means for selecting a value of the frequency range setting based on the first difference and the second difference.

According to some embodiments, an integrated circuit having a phase locked loop (PLL) includes a voltage controlled oscillator (VCO) controller for setting a frequency range setting of a voltage controlled oscillator (VCO) to a first digital value for a first output frequency and setting the frequency range setting to an inverted digital value of the first digital value for a second output frequency. A PLL controller measures a first difference between a reference frequency and a feedback frequency resulting from the first output frequency and also measures a second difference between the reference frequency and the feedback frequency resulting from the second output frequency. The VCO controller is configured to decide whether a target frequency is between the first output frequency and the second output frequency, to increase the first digital value of the frequency range setting if the target frequency is not between the first output frequency and the second output frequency, and to select a value of the frequency range setting based on the first difference and the second difference.

A skilled person in the art will appreciate that there can be many embodiment variations of this disclosure. Although the embodiments and their features have been described in detail, it should be understood that various changes, substitutions and alterations can be made herein without departing from the spirit and scope of the embodiments. Moreover, the scope of the present application is not intended to be limited to the particular embodiments of the process, machine, manufacture, and composition of matter, means, methods and steps described in the specification. As one of ordinary skill in the art will readily appreciate from the disclosed embodiments, processes, machines, manufacture, compositions of matter, means, methods, or steps, presently existing or later to be developed, that perform substantially the same function or achieve substantially the same result as the corresponding embodiments described herein may be utilized according to the present disclosure.

The above method embodiment shows exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within the scope of the disclosure and will be apparent to those skilled in the art after reviewing this disclosure.

What is claimed is:

1. A method for self-calibrating a phase locked loop (PLL), comprising:
    setting a frequency range setting of a voltage controlled oscillator (VCO) to a series of sequential digital values for a series of respective sequential output frequencies, including setting the frequency range to a first digital value for a first output frequency, wherein in an initial setting of the frequency range to a first digital value the first digital value is set to $2^{(N-1)}$, N being a number of bits of the frequency range setting, wherein N is at least three;
    measuring a first difference between a reference frequency and a feedback frequency resulting from the first output frequency;
    calculating an inverted digital value of the first digital;
    setting the frequency range setting to the inverted digital value of the first digital value calculated in the calculating step as the next digital value in the series of sequential digital values for a second output frequency;
    measuring a second difference between the reference frequency and the feedback frequency resulting from the second output frequency; and
    selecting a value of the frequency range setting based at least in part on the first difference and the second difference.

2. The method of claim 1, further comprising deciding whether a target frequency is between the first output frequency and the second output frequency.

3. The method of claim 2, further comprising changing the first digital value of the frequency range setting if the target frequency is not between the first output frequency and the second output frequency.

4. The method of claim 1, further comprising setting a VCO input voltage to an initial voltage.

5. The method of claim 4, wherein the initial voltage is a middle voltage value of a range of the VCO input voltage.

6. The method of claim 4, wherein the initial voltage is provided by a controlled voltage circuit.

7. The method of claim 6, further comprising disconnecting from the controlled voltage circuit by a switch after selecting the value of the frequency range setting.

8. The method of claim 1, further comprising providing a reset signal to initialize the frequency range setting.

9. The method of claim 1, wherein measuring the first difference is based on a first time difference between rising edges of signals corresponding to the reference frequency and the feedback frequency.

10. The method of claim 1, wherein measuring the second difference is based on a second time difference between rising edges of signals corresponding to the reference frequency and the feedback frequency.

11. A phase locked loop (PLL) with self-calibration, comprising:
a voltage controlled oscillator (VCO); and
a controller module adapted to:
set a frequency range setting of the VCO to a series of sequential digital values for a series of respective sequential output frequencies, including a first digital value for a first output frequency, wherein in an initial value of the first digital value is $2^{(N-1)}$, N being a number of bits of the frequency range setting, wherein N is at least three;
measure a first difference between a reference frequency and a feedback frequency resulting from the first output frequency;
set the frequency range setting to an inverted digital value of the first digital value for a second output frequency as the next digital value in the series of sequential digital values;
measure a second difference between the reference frequency and the feedback frequency resulting from the second output frequency; and
select a value of the frequency range setting based on the first difference and the second difference.

12. The PLL of claim 11, wherein the controller module is further adapted to decide whether a target frequency is between the first output frequency and the second output frequency.

13. The PLL of claim 12, wherein the controller module is further adapted to change the first digital value of the frequency range setting if the target frequency is not between the first output frequency and the second output frequency.

14. The PLL of claim 11, wherein the controller module is further adapted to set a VCO input voltage to an initial voltage.

15. The PLL of claim 14, wherein the initial voltage is a middle voltage value of a range of the VCO input voltage.

16. The PLL of claim 14, wherein the initial voltage is provided by a controlled voltage circuit.

17. The PLL of claim 16, wherein the controller module is further adapted to disconnect from the controlled voltage circuit after selecting the value of the frequency range setting.

18. The PLL of claim 11, wherein the controller module is further adapted to provide a reset signal to initialize the frequency range setting.

19. An integrated circuit having a phase locked loop (PLL) comprising:
a voltage controlled oscillator (VCO) controller for setting a frequency range setting of a voltage controlled oscillator (VCO) to a series of sequential digital values for a series of respective sequential output frequencies, there being more than four output frequencies in the series of respective sequential output frequencies, including a first digital value for a first output frequency and setting the frequency range setting to an inverted digital value of the first digital value for a second output frequency as the next digital value in the series of sequential digital values, an initial value of the first output frequency being a middle output frequency in the series of respective sequential output frequencies; and
a PLL controller for measuring a first difference between a reference frequency and a feedback frequency resulting from the first output frequency, measuring a second difference between the reference frequency and the feedback frequency resulting from the second output frequency, and deciding whether a target frequency is between the first output frequency and the second output frequency;
wherein the VCO controller is configured to change the first digital value of the frequency range setting if the target frequency is not between the first output frequency and the second output frequency, and to select a value of the frequency range setting based on the first difference and the second difference.

* * * * *